July 25, 1961 R. N. HALL 2,994,018

ASYMMETRICALLY CONDUCTIVE DEVICE AND METHOD
OF MAKING THE SAME

Original Filed Sept. 29, 1950

Inventor:
Robert N. Hall,
by Richard R. Brainard
His Attorney.

United States Patent Office 2,994,018

Patented July 25, 1961

2,994,018

ASYMMETRICALLY CONDUCTIVE DEVICE AND METHOD OF MAKING THE SAME

Robert N. Hall, Schenectady, N.Y., assignor to General Electric Company, a corporation of New York Continuation of abandoned application Ser. No. 187,478, Sept. 29, 1950. This application July 10, 1956, Ser. No. 596,943

37 Claims. (Cl. 317—235)

Figure 1:
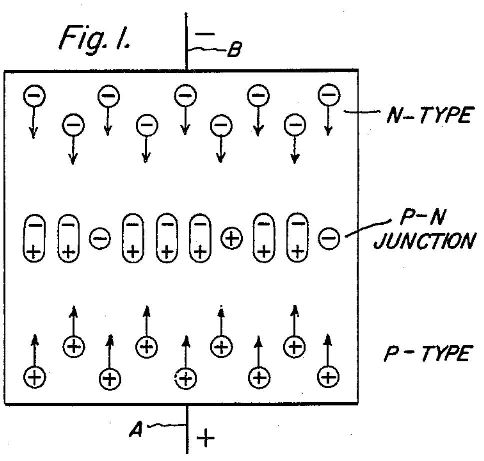

My invention relates to asymmetrically conductive devices and, more particularly, to asymmetrically conductive devices employing semiconductors of the type represented by germanium or silicon as the effective member thereof, and to methods of making such devices. This application is a continuation of my copending application Serial No. 187,478 filed September 29, 1950 and assigned to the same assignee as the present application, and now abandoned.

Semiconductors are materials whose electric conductivity lies between the poor conductivity of "insulators" and the good conductivity of certain metallic "conductors." Conduction in semiconductors is primarily electronic; the conduction carriers being either electrons or electron vacancies produced by the movement of electrons. The conductivity of semiconductors is usually greatly affected by changes in temperature and by impurities found in the semiconductors. Although the present invention may utilize various semiconductors, its chief advantages and its widest commercial applications are realized when semiconductors which have a diamond lattice crystal structure and which are found in group IV of the periodic table of elements, such as germanium and silicon, are employed.

A wide field of application for semiconductors has been found in asymmetrically conductive devices having an electrode in punctiform surface contact with the semiconductor such as "cat whisker" diodes and, more recently, in transistors of the point contact type. These devices employ the rectifying properties of a substantially punctiform surface contact between the semiconductor and a suitable metallic electrode. The contact area is usually around .0005 inch and rarely exceeds .001 inch in diameter. The amount of current that normally can be passed through such small area contacts without burn-out is small; in the neighborhood of 100 milliamperes, and the utility of such devices has accordingly been limited to low current applications. Moreover, the mechanical fragility of such devices due to the required small area contact has been a serious problem wherever considerable vibration or rough handling is involved.

Semiconductors, such as germanium or silicon, have become conventionally classified as either positive (P-type), negative (N-type), or intrinsic (neither positive nor negative), depending primarily upon the type and sign of their predominant conduction carriers. With P-type semiconductor, the direction of rectification as well as the polarity of a thermo-electric or Hall-effect voltage, are all opposite to that produced with the N-type semiconductor. According to prevailing theory, conduction in N-type material is primarily electronic, in other words by means of the movement of free electrons; while conduction in P-type material is primarily by means of the movement of what have become known as "positive-holes" which arise from electron vacancies in the electronic system of atoms of the semiconductor.

It has been found that the determinant of whether a particular semiconductor exhibits N or P-type characteristics lies primarily in the type of impurity elements present in the semiconductor. Some impurity elements, termed "donors," having a higher valence than the semiconductor function to furnish additional free electrons to the semiconductor so as to produce an electronic excess N-type semiconductor, while other impurity elements, termed "acceptors," having a lower valence than the semiconductor function to absorb the electrons to create P-type semiconductor with an excess of "positive-holes." Antimony, phosphorus, arsenic falling in group V of the periodic table are examples of "donor" impurities found in N-type germanium or silicon semiconductor, while aluminum, gallium and indium falling in group III of the periodic table are examples of "acceptor" impurities for germanium or silicon semiconductors; it being realized that silicon and germanium fall in group IV of the periodic table. Only very small amounts of these impurity elements are normally necessary to produce marked electrical characteristics of one type or the other. Concentrations of some impurities of less than one part per million may be sufficient.

Intrinsic semiconductor, which is a semiconductor that exhibits neither P-type nor N-type characteristics, usually results from either a substantially complete freedom of impurities or from an electrical balance between the conduction carriers produced by acceptor and donor impurities in the semiconductor. Due to the strong electrical effect produced by small amounts of these impurity elements, samples of intrinsic semiconductor are difficult to prepare requiring the use of very exacting purification methods.

It has been known for some time that if a substantially pure semiconductor ingot is prepared by solidification from a melt, the ingot may contain regions of P-type and N-type semiconductor separated by a thin region of intrinsic material forming a rectifying barrier layer called a "P-N junction," This P-N junction possesses marked rectifying as well as thermo-electric and photoelectric properties. When a piece of semiconductor bisected by this P-N junction is cut out of the ingot, an electric current may be passed easily in only one direction through the junction, and a potential difference may be produced between the P and N-type material upon opposite sides of this junction by concentrating light or heat upon the junction.

Attempts have heretofore been made to employ units containing a P-N junction and extracted in this manner in the construction of asymmetrically conductive devices having a rectifying area which is substantially larger than that of point-contact devices. Such semiconductor asymmetrically conductive devices have a "large area" rectifying region in comparison with the "small area" rectifying region of point-contact devices; this large-area rectifying region being usually greater than .1 square inch and rarely less than .001 square inch. However, since only the region of the ingot which is adjacent the P-N junction is suitable for use in asymmetrically conductive devices, the number of available units from any one ingot is limited; and the production of such units is, therefore, expensive and time consuming. In addition, the electrical properties of any particular wafer extracted in this manner are almost completely unpredictable and uncontrollable, and the wafer may contain many non-homogeneous areas in even very small units. Moreover, the essentially linear attenuation of the impurity distribution in the neighborhood of the P-N junction of a solidified ingot limits the ratio between forward and back resistance which is attainable across such extracted P-N junction units as well as the reverse peak voltage withstanding capacity of rectifying devices produced therefrom. For example, only few such extracted P-N junction units normally have a forward to back resistance ratio greater than 1000 to 1 or can withstand peak inverse voltages in the neighborhood of 100 volts.

Accordingly, an important object of my invention is to provide commercially practical asymmetrically conductive devices employing semiconductor units which have a "large-area" rectifying region in comparison with the "small-area" rectifying region of point-contact devices, and which are capable of rectifying fairly heavy currents including in some constructions, currents of many amperes without burn-out.

Another object of my invention is to provide a semiconductor asymmetrically conductive device with a large-area rectifying region which has a simple and economical construction and which lends itself to mass production techniques.

Another object of my invention is to provide an asymmetrically conductive device with a large-area rectifying region which employs semiconductor units extracted from any portion of practically the entire area of a semiconductor ingot.

Another object of my invention is to provide an asymmetrically conductive device having a large area rectifying region of fairly controllable and substantially predictable rectifying properties.

A further object of my invention is to provide an asymmetrically conductive device with a large-area rectifying region which has a high ratio of forward to back resistance usually above $10^5$ to 1 and which is capable of withstanding high peak inverse voltages normally including voltages as high as 200 volts.

A still further object of my invention is to provide simple and economical methods of making semiconductor asymmetrically conductive devices having a large-area rectifying region.

In general, my improved asymmetrically conductive device comprises a crystal of high purity semiconductor having predetermined conduction characteristics i.e. either P-type, N-type, or intrinsic, with at least one surface region heavily impregnated by a diffusion of an impurity element to a partial depth within the semiconductor. The diffused impurity element must be one which induces a predominance of conduction carriers into the diffused region which are of opposite sign to that of the conduction carriers of the selected piece of semiconductor. As a consequence, a P-N junction region is produced within the semiconductor piece at the boundary of the depth of penetration of the diffusion of the impurity element. If intrinsic semiconductor is selected, and preferably even when P-type or N-type semiconductor is selected, at least two adjacent impurity diffused regions are employed. For two electrode devices, one of these regions is impregnated by a diffusion of a "donor" impurity element to produce N-type characteristics therein while the other region is impregnated by a diffusion of an "acceptor" impurity element to produce P-type characteristics therein. The depth of penetration of the diffusion of these impurity elements is controlled to be such that an undiffused region of semiconductor comprising the P-N junction conduction barrier region separates the two impurity-impregnated regions. For three electrode devices, two distinct surface-adjacent regions of the semiconductor are impregnated by a diffusion of an impurity capable of inducing conduction carriers of opposite sign to that originally present in the semiconductor body, and two P-N junctions result at the boundaries of the two impurity diffused regions. Suitable electrodes are secured in good conductive relation with the semiconductor on opposite sides of the P-N junction or junctions. The two-electrode device thus comprises an electrode-connected acceptor-impurity-diffused P-type region and adjacent electrode-connected donor-impurity-diffused N-type region; while the three-electrode device comprises two electrode-connected donor-impurity-diffused N-type regions with an intermediate electrode-connected P-type region, or two acceptor-impurity-diffused P-type regions with an intermediate electrode-connected N-type region; the adjacent P and N-type regions of the devices being separated by P-N junctions. External surface portions of the impurity elements may be etched to prevent possible short circuiting of the junction area as well as to improve the conduction characteristics of the device.

In making such large rectifying area asymmetrically conductive devices, an impurity element capable of inducing predetermined sign conduction carriers in the semiconductor is brought into surface contact with a portion of the semicondctor and a diffusion of the impurity element to a partial depth within the semiconductor is effected, preferably by a heating cycle. If two impurity elements capable of inducing opposite type conduction carriers are employed, surface contact is made between the impurity elements and two adjacent surface portions of the semiconductor, either on the same side or on opposite sides thereof. Diffusion of both impurity elements is then effected, preferably by a single stage heating cycle and preferably until only a thin region of separation remains between the impurity diffused regions although the thickness of the separation region does not appear to be very critical. Suitable electrodes for the device may be secured in conduction relation with the semiconductor on opposite sides of the P-N junction either before, during, or after the impurity elements are diffused into the semiconductor.

Figure 2:
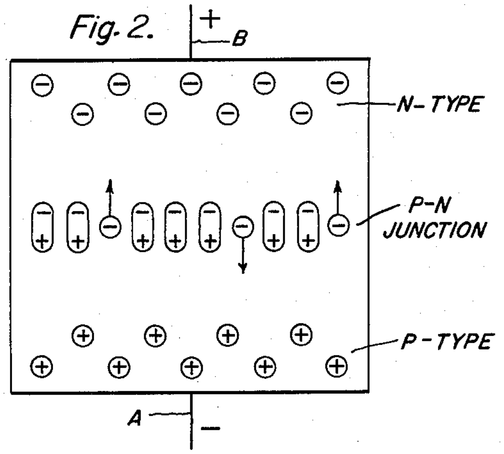
Figures 3, 6:
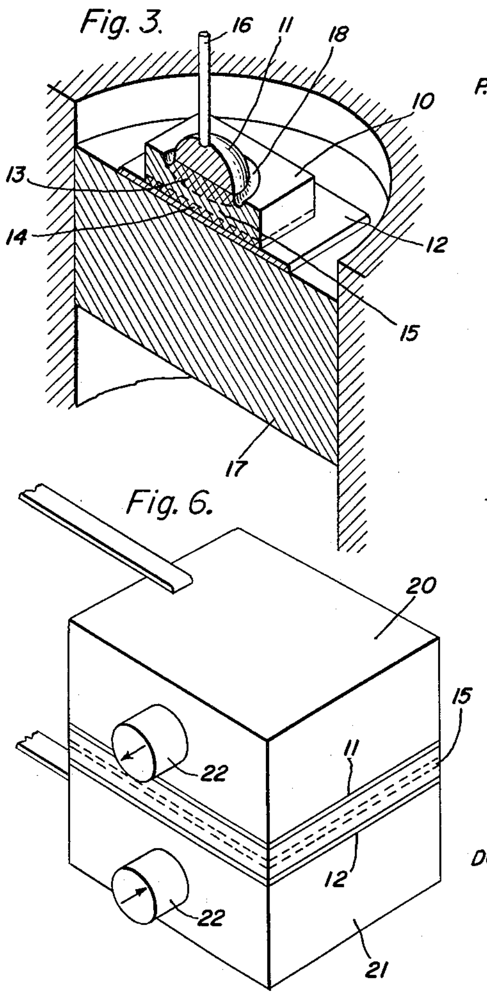
Figure 4:
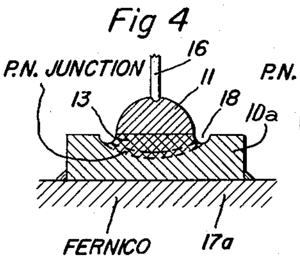
Figure 5:
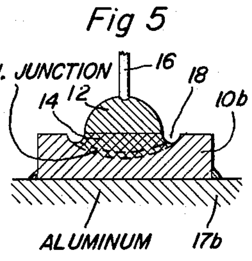
Figure 7:
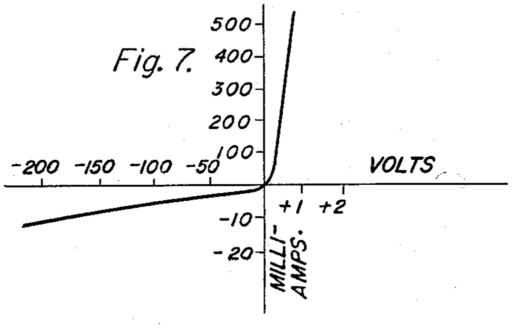
Figure 8:
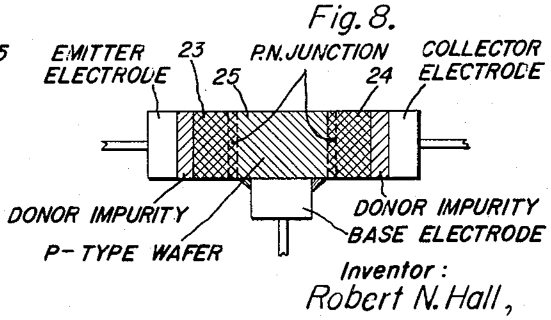

The novel features which I believe to be characteristic of my invention, are set forth with particularity in the appended claims. My invention itself, together with further objects and advantages thereof can best be understood by reference to the following description taken in connection with the accompanying drawing in which FIGURES 1 and 2 are diagrams illustrating the movement of conduction carriers within a semiconductor unit containing a P-N junction; FIGURE 3 is a cross-sectional perspective view of an asymmetrically conductive device constructed in accordance with my invention; FIGURES 4, 5 and 6 are modifications of the device of FIGURE 3; FIGURE 7 is a curve showing typical static characteristics of the devices shown in FIGURES 3, 4 and 5; and FIGURE 8 is a cross-sectional view of a large rectifying area "transistor" produced in accord with my invention.

In order to enable a better understanding of my invention, I have depicted in FIGURES 1 and 2 a simplified diagrammatic portrayal of the movement of conduction carriers within a semiconductor unit containing a P-N junction when subjected to a reversal of an applied electric field. Referring to FIGURE 1, I have shown a semiconductor body, such as a crystal of germanium, having one end P-type, the other end N-type and having an intermediate region of intrinsic semiconductor comprising the P-N junction. The P-type portion contains an excess of positive conduction carriers or "holes," shown as a plurality of encircled plus signs; while the N-type semiconductor contains an excess of free electrons, shown as encircled minus signs. In the P-N junction region both types of conduction carriers are substantially in electrical balance with the electrons being "bound" or "captured" within the available holes, as indicated to produce a region of minimum conductivity or "barrier." A few thermally excited carriers, shown as free positve or negative charges, normally still exist in this intrinsic P-N junction region.

Conductivity through the semiconductor is proportional to the available carriers within the semiconductor itself and appears to be limited thereby. Therefore, if an electric field is applied to the semiconductor in the direction indicated by the designated polarity of voltage applied to conductors A and B respectively, the positive holes are swept, as indicated by the arrows, toward the opposite negative conductor B, and the negative electrons toward the opposite positive conductor A. If the distance is small, usually no larger than one centimeter, these holes and electrons are normally swept past each other without recombining to produce high conductivity in this "forward" direction. When the polarity of the electric field is reversed, as depicted in FIGURE 2, there are no available holes in the N region and no available electrons in the P region to provide an internal conduction path whereby the external circuit may be completed. As a consequence, conductivity is limited in this reverse direction to the rate at which holes and electrons are generated in the intrinsic region. Of course, if a sufficiently high electric field is applied, this reverse direction barrier may be broken down enabling a reverse current flow through the semiconductor.

It will, therefore, be appreciated that the rectifying properties of the P-N junction semiconductor units depend upon the availability of positive holes and electrons in the respective P and N type regions and upon the composition of the intermediate P-N junction region.

Referring now to FIGURE 3, I have shown an asymmetrically conductive device made in accordance with my invention which utilizes such a P-N junction region. A semiconductor 10, preferably comprising a thin wafer as indicated, is cut from any portion of an ingot of germanium which has been highly purified to have a high bulk resistivity ranging from about 1 to 50 ohm centimeters. The high purity germanium ingot may comprise either P-type, N-type or intrinsic germanium but preferably comprises germanium almost completely free of all types of impurities such as to have a bulk resistivity of about 30–50 ohm centimeters and thus to fall within the intrinsic germanium classification. Such highly purified thin germanium or silicon crystals, commonly called "wafers" or "pellets," are now widely used in point contact devices, and their method of preparation is well known to the art, and will, therefore, not be described here. The adjective "thin" as above applied to the wafer 10 is employed to define a semiconductor piece usually having a thickness no greater than .05 inch and preferably between .01 inch and .04 inch since the highest ratio of forward to back resistance is normally attainable in this thickness range. Wafers of a thickness less than .01 inch make it difficult to effect an impurity diffusion to only a parital depth within the wafer, while wafers of a thickness greater than .04 inch produce rectifying units often having unduly high forward resistance.

An "acceptor" impuritiy element 11, such as indium, is then secured to a portion of one major face of the wafer 10 and a "donor" impurity element 12, such as antimony, is secured to the opposite major face thereof. Impurity elements 11 and 12 may be applied in any state, either solid, liquid or suspended in a gaseous atmosphere; and in any manner which brings about surface contact with the semiconductor, such as by smearing, laying, evaporating, or conductively bonding the impurity element on a surface portion of the wafer 10. Preferably the impurity elements 11 and 12 are applied as a solid and are secured to the semiconductor 10 by fusion during a heating cycle to be described hereinafter. The area of application of one of these impurity elements, such as element 11, is preferably kept as small as is consistent with the desired current handling capacity of the device in order that the resultant P-N junction barrier region may be confined to as small a region as possible and thereby minimize reverse current leakage due to faults in the conduction barrier produced by the P-N junction. A small droplet of one impurity element, such as illustrated for impurity element 11, having a contact area of about .01 square inch is normally sufficient to produce a P-N junction unit capable of handling currents of several amperes.

A surface region 13 of the wafer 10 located immediately adjacent the external surface portion of the "acceptor" impurity element 11 and indiacted by crossed lines, contains a diffused concentration of this "acceptor" impurity element. Similarly, a surface region 14 of the wafer 10 located adjacent the "donor" impurity element 12 contains a diffused concentration of this latter impurity element. The region 13, therefore, contains strong P-type conduction characteristics, while the region 14 contains strong N-type conduction characteristics. The method of producing a diffusion of these impurity elements 11 and 12 into the wafer 10, to be described hereinafter, formed a portion of the subject matter and was claimed in a copending application, Serial No. 187,490, now abandoned, filed the same day as the present application by William C. Dunlap and assigned to the assignee of the present invention. My present invention is an improvement over the invention of this Dunlap application, which invention was made by the said Dunlap prior to my invention. I, therefore, do not herein claim anything disclosed in this Dunlap application which is to be regarded as prior art with respect to the present application.

A region 15 intermediate the impurity-impregnated regions 13 and 14 comprises the general P-N junction conduction barrier region and consists of either N, P or intrinsic type as initially selected for the wafer 10. Region 15 should have a thickness no greater than .030 inch and preferably less than .015 inch although a thickness above .030 inch may be desirable in some applications where a low forward resistance characteristic is not required. If N-type germanium is selected for wafer 10, the actual conduction barrier portion of the region 15 is localized near the internal boundary of the acceptor region 13, while if P-type germanium is selected, the actual conduction barrier portion of the region 15 is localized adjacent the internal boundary of the "donor" region 14.

Electrodes 16 and 17 are secured in good conductive relation with the donor and acceptor regions 13 and 14 respectively. Preferably, they are fused to external portions of the donor and acceptor impurity elements directly. In order to facilitate the construction of the device, one of these electrodes, such as electrode 17, may comprise a highly conductive metallic plug, such as fernico, upon which a layer or strip of the impurity element 12 is placed. The wafer 10 is then merely seated upon this layer of impurity element 12 and the entire unit secured together by a heating cycle to be described hereinafter.

Referring now to FIGURE 4, I have shown a modification of my invention whereby a high resistivey N-type germanium wafer 10*a* is employed but only one diffused region, corresponding to the acceptor region 13, need be produced. The device of FIGURE 4 is similar to that shown in FIGURE 3 with the exception that only one impurity element, namely the "acceptor" impurity element 11, is applied to the surface and diffused into the germanium wafer 10*a*. The type of conductor used to make contact to the opposite side of the wafer 10*a*, is not very critical and may comprise any element capable of supplying free electrons to the semiconductor. A "donor" impurity element is, of course, acceptable for this latter contact, but certain other electron supplying elements such as tin will also be suitable. The germanium wafer 10*a* may, for example, be directly soldered or otherwise secured in good conductive relation to a fernico plug 17*a*, as indicated in FIGURE 4.

In FIGURE 5 I have shown a similar modification of my improved asymmetrically conductive device of FIGURE 3, wherein a P-type germanium wafer 10*b* is used. In FIGURE 5 it is the diffusion of the "donor" impurity element 12 which determines the P-N junction and which is, therefore, applied to only a small surface area of the germanium wafer 10*b*. In this case any type of conductor capable of supplying positive holes to the wafer may be used for the opposite electrode. Here again, acceptor elements may be used but positive hole supplying elements other than acceptors may serve the purpose of this conductor. As shown in FIGURE 5 the germanium wafer may, therefore, be directly secured in conductive relation with any one of these positive hole conductor elements, designated as aluminum in FIGURE 5.

In the construction of the device shown in FIGURE 3, the fernico plug 17 is first seated in a suitable casing, and the "donor" impurity element 12, the germanium wafer 10, and the "acceptor" impurity element 11 placed thereon in layers to form a type of modified sandwich construction. The entire unit is then heated at a temperature sufficient to cause a diffusion of both impurity elements into the germanium wafer. Heating may be accomplished by any suitable means, such as by placing the unit in an oven or in the center of a heating coil, or by the use of induction heating. This heating cycle is maintained for only a short period of time usually no longer than one minute so that surface penetration of each impurity element to only a limited depth will occur. If the temperature of heating is too high or the period too long, the diffusion of one impurity element may extend into the area of the opposite diffusion region and short-circuit the unit. With limited surface penetration, as indicated in FIGURE 3, a P-N junction unit is produced having a highly concentrated P-type region near one surface, a highly concentrated N-type region near the other surface, and a fairly pronounced P-N junction barrier region intermediate these two impurity-impregnated regions.

Due to this heating cycle, a certain amount of alloying between the plug 17, the semiconductor 10 and the impurity elements 11 and 12 normally occurs, with the result that the entire modified sandwich-like construction is securely fused or bonded together. If an impurity element is employed for element 12 which does not readily fuse with the metallic plug 17, additional conductive bonding agents such as solder, may be previously applied between their adjacent surfaces, or the prepared P-N junction semiconductor unit may be soldered to the plug 17 upon completion of the heating cycle.

It may also be found that, in some cases, the rate of diffusion of one of the impurity elements, at its optimum diffusion temperature, is much greater than the rate of a diffusion of the opposite type impurity element employed. In such a case the former impurity element may tend to diffuse complete throughout the germanium wafer before the other impurity element has even begun to diffuse thereinto. Under these conditions the construction of the device may be accomplished by employing two heating cycles; the less mobile element being applied and diffused into the germanium during the first heating cycle, and the more mobile impurity element being applied and diffused during a subsequent heating cycle.

After the above-described P-N junction unit is formed, the electrode 16 may be secured on good conductive relation with the acceptor impurity diffused region 13. Preferably electrode 16 is connected to the "acceptor" impurity element 11 by any suitable means such as soldering. Alternatively this electrode may be fused to the impurity element while the element is being subjected to the heating cycle.

The construction of the asymmetrically conductive devices illustrated in FIGURES 4 and 5, is essentially similar to that described above with relation to FIGURE 3 with the exception that the application and diffusion of one impurity element, either "donor" or "acceptor" depending upon the type of germanium wafer employed, is omitted. In these latter devices, the P-N junction is produced at the boundary of the depth of penetration of the diffusion of the applied impurity element. The method of producing such P-N junctions in germanium units of predetermined type, is also described and claimed in the above-mentioned copending application of W. C. Dunlap.

In order to remove surface contamination and to prevent a short-circuiting of the P-N junction barrier region, a chemical or electro-chemical etch may be applied to the exposed surface of these units in the region of the impurity elements after completion of the diffusion process. This generally results in a marked improvement in the forward-to-back conduction characteristic. When an indium contact 11 is used on germanium, this etching step usually produces a rather distinct trough such as designated by numeral 18. Preferably, the entire unit is immersed within an etchant, such as 10% potassium hydroxide, while a current is passed through the unit for a short length of time, in the neighborhood of 30 seconds. The electrolytic method of removing the rectification barrier short circuit is not my invention and is described and claimed in a co-pending application, Serial No. 268,272 filed by R. J. Herbert, January 25, 1952, now Patent 2,783,197 and assigned to the assignee of this application. Alternatively, the unit may be temporarily immersed in concentrated nitric acid.

Although in FIGURE 3, I have shown the "acceptor" element as comprising the smaller element while the "donor" element as the larger, it will be appreciated that the locations and relative size of these impurity elements may be reversed. Moreover, it is not essential that the donor and acceptor impurity elements be applied to opposite major faces of the wafer 10. Any method of producing adjacent opposite type diffused regions, such as with side-by-side impurity element applications, may be employed.

It will also be apparent that a complete layer of both "donor" and "acceptor" impurity elements may be applied to opposite major faces of the wafer 10 rather than confining one of the impurity elements to only a small surface portion of the semiconductor. If both major surfaces of the semiconductor wafer 10 are completely covered by respective "donor" and "acceptor" impurity elements, a complete sandwich type construction, such as shown in FIGURE 6, results. Such a construction will, of course, have the advantage of greater current capacity and mechanical rigidity than the devices shown in FIGURES 3, 4 and 5. In addition, heavy lugs, such as lugs 20 and 21, may be used for the electrodes and may be water cooled by virtue of internal conduits 22 to increase the current handling capacity of the device.

The temperatures employed for the heating cycle depend to a large extent upon the specific impurity elements employed. The temperatures, for example, at which diffusion into germanium occurs for practically all of the known "acceptor" and "donor" impurity elements, lie within a range of 200 to 700 degrees centigrade. In general, the lower limit of temperatures to be applied for any particular impurity element, depends upon the temperature at which that element begins to wet germanium in the sense that a discernable degree of penetration begins. For indium, for example, this temperature is in the neighborhood of 250 degrees, while the wetting temperature of antimony, however, is in the neighborhood of 600 degrees. The upper limit of temperature, on the other hand, is determined largely by the temperature at which these impurity elements completely alloy with the germanium. This usually occurs at temperatures in the neighborhood of 700 to 800 degrees centigrade.

The length of time necessary for the diffusion of these impurity elements into germanium is usually quite short, normally less than one minute. Here again, the optimum time to be employed is dependent largely upon the thickness of the wafer employed and upon the type of impurity element chosen. It can be easily determined by a few preliminary experiments or by reference to known chemical texts which discloses the diffusion properties of the various elements concerned.

The conduction characteristics that are typical for units constructed in the manner described in connection with FIGURES 3, 4 and 5, is shown in the curve of FIGURE 7. In FIGURE 7, voltage applied across the electrodes 16 and 17 is plotted along the horizontal axis and the current conduction through the device along the vertical axis. As indicated by the curve, currents in the neighborhood of 500 milliamperes are easily handled and currents as high as 5 amperes have been passed with a forward voltage of only one volt, while reverse voltages up to 400 volts are withstood without passing any appreciable current. Forward resistances of approximately .2 ohm have been obtained with back resistances between 100,000 to 1,000,000 ohms. With watercooled semiconductor units constructed as in FIGURE 6, currents as high as 200 amperes have been handled by relatively small units without breakdown. The forward resistance obtained with water-cooled units having a contact area of one square centimeter is extremely low, in the neighborhood of .001 ohm, and although the back resistance is much less than with the confined contact area units of FIGURES 3, 4 and 5, it is still high enough to provide good rectification.

Another important property of the above-described P-N junction asymmetrically conductive devices is that the power dissipation of these devices is roughly from one-fifth to one-tenth of that produced by other known types of dry rectifier elements. This feature permits much higher current handling capacity with a smaller unit.

The reason for this marked improvement in the rectification characteristics of P-N junction units, made in accordance with my invention over rectifying units produced by cutting out the P-N junction region from a directionally cooled ingot, is believed to lie in the much heavier concentration of conduction carriers in the impurity diffused areas of the above-described devices, and in the much thicker and more uniform junction area that is produced thereby.

In adidtion, both the degree of impurity concentration as well as the depth of penetration thereof can be controlled to optimum values by the method of producing large area P-N junction devices outlined above.

It will also be appreciated that an asymmetrically conductive device employing P-N junctions produced as described above, may be constructed with three electrodes to form a transistor capable of fulfilling an amplifying function in suitable circuits. When constructed for this purpose a N-P-N junction unit may be produced as shown in FIGURE 8 in accordance with the above-described techniques. In this "transistor" of FIGURE 8 a P-type semiconductor piece is initially selected for the unit, and two donor impurity diffused regions 23 and 24 are formed on opposite sides of the semiconductor. An "emitter" electrode is then connected to one donor impurity-diffused N-type region 23, a collector electrode is connected to an opposite impurity-diffused N-type region 24, and the base electrode is secured to the remaining central P-type portion 25 of the semiconductor. An N-type wafer may be substituted for P-type wafer 25 and acceptor impurity diffused regions substituted for the donor impurity regions 23 and 24 of FIGURE 8. Other combinations of P-N junction units produced in accordance with my invention and suitable for wide area transistors will, of course, occur to those skilled in the art.

It is to be understood that although I have shown particular embodiments of my invention, many modifications may be made, and I intend, therefore, by the appended claims to cover all such modifications as fall within the true spirit and scope of my invention.

What I claim as new and desire to secure by Letters Patent of the United States is:

1. An asymmetrically conductive device comprising a crystal of high purity semiconductor, an acceptor impurity element fused to a first surface portion of said semiconductor and diffused into said semiconductor a limited amount to provide a first surface adjacent region having P-type conduction characteristics, a donor impurity element fused to a second surface portion of said semiconductor and diffused into said semiconductor a limited amount to provide a second surface adjacent region having N-type conduction characteristics, said first and second regions being separated by a remainder region of said high purity semiconductor, and a pair of electrodes each connected to a different impurity diffused region.

2. The asymmetrically conductive device of claim 1 wherein the high purity semiconductor crystal comprises intrinsic germanium having a bulk resistivity above 30 ohm centimeters.

3. The asymmetrically conductive device of claim 1 wherein the high purity semiconductor crystal comprises P-type germanium having a bulk resistivity above 1 ohm centimeter.

4. The asymmetrically conductive device of claim 1 wherein the high purity semiconductor crystal comprises N-type germanium having a bulk resistivity above 1 ohm centimeter.

5. An asymmetrically conductive device comprising a crystalline wafer of high purity germanium, an acceptor impurity element fused to one face of said wafer and partially diffused thereinto a limited depth to provide a first surface region having strong P-type conduction characteristics, a donor impurity element fused to an opposite face of said wafer and diffused thereinto a limited depth to provide a second surface region having strong N-type conduction characteristics, said first and second surface regions being separated by a thin remainder region of said high purity germanium wafer, and a pair of electrodes each fused to and with the undiffused portion of a respective one of said acceptor and donor impurity elements.

6. The asymmetrically conductive device of claim 5 wherein the high purity germanium wafer comprises a flat wafer of intrinsic germanium having a thickness no greater than 0.050 inch.

7. The asymmetrically conductive device of claim 5 wherein the high purity germanium wafer has a thickness no greater than 0.050 inch and comprises N-type germanium having a bulk resistivity above 1 ohm centimeter.

8. The asymmetrically conductive device of claim 5 wherein the high purity germanium wafer has a thickness no greater than 0.050 inch and comprises P-type germanium having a bulk resistivity above 1 ohm centimeter.

9. An asymmetrically conductive device comprising a thin crystalline wafer of highly purified germanium, a layer of antimony secured to one major face of said wafer and partially diffused thereinto a limited depth to provide a first surface adjacent region having strong N-type conduction characteristics, a layer of indium secured to an opposite face of said wafer and partially diffused thereinto a limited depth to provide a second surface adjacent region having strong P-type conduction characteristics, said first and second surface regions being separated by a remainder undiffused region of said highly purified germanium wafer, and a pair of electrodes each fused to and with the undiffused portion of a respective one of said acceptor and donor impurity elements.

10. An asymmetrically conductive device comprising a thin crystalline wafer of highly purified germanium, an acceptor impurity element fused to a portion of one major face of said wafer and diffused thereinto to a limited depth to provide a first surface region having strong P-type conduction characteristics, a donor impurity element fused to an opposite face of said wafer and diffused thereinto a limited depth to provide a second surface region having strong N-type conduction characteristics, said first and second surface regions being separated by a region of highly purified germanium of said wafer, a pair of electrodes each connected to a respective one of said acceptor and donor impurities, and said device being etched over a surface encompassing the juncture of said acceptor impurity element with said wafer.

11. An asymmetrically conductive device comprising a thin crystalline wafer of highly purified germanium, an acceptor impurity element fused to one of the major faces of said wafer and diffused thereinto to a limited depth to provide a first surface region having strong P-type conduction characteristics, a donor impurity element fused to a portion of the opposite major face of said wafer and diffused thereinto to a limited depth to provide a second surface region having strong N-type conduction characteristics, said first and second regions being separated by a region of said highly purified germanium wafer, a pair of electrodes each connected to a respective one of said donor and acceptor impurity elements, and said device having an etched surface encompassing the juncture of the donor impurity element with said wafer.

12. The method of making an asymmetrically conducting unit suitable for use in asymmetrically conductive devices, which method comprises applying a first slow-diffusing impurity element, selected from a class consisting of both donor and acceptor type impurity elements, to a first surface area of a crystal of high purity semiconductor; temporarily heating said semiconductor and first impurity element at a first predetermined temperature to diffuse said impurity element to a partial depth within said semiconductor piece; applying a second fast-diffusing impurity element, selected from the other type impurity elements of said class to a surface area of said crystal remote from said first surface area; and heating said semiconductor crystal and both said impurity elements at a second predetermined temperature to produce a diffusion of said second impurity element to a partial depth extending adjacent without touching said first impurity diffusion region within said semiconductor crystal.

13. An asymmetrically conductive device comprising a crystal of high purity semiconductor having predetermined sign conduction characteristics, two impurity elements applied to different surface areas of said semiconductor and each partially diffused into different surface-adjacent regions of said semiconductor, said impurity elements being selected from a class consisting of donor and acceptor impurities and inducing strong conduction characteristics in said diffused regions of opposite sign to said predetermined sign conduction characteristics of said semiconductor to provide P-N junctions with the remainder undiffused portion of said semiconductor at the boundaries of the diffused penetration of said impurity elements, two electrodes fused to and with respective impurity elements, and a third electrode secured in conductive relation with said remainder undiffused portion of said semiconductor.

14. An asymmetrically conductive device comprising a high purity crystalline semiconductor body having P-type conduction characteristics, a pair of donor impurity elements on opposite sides of said body and partially diffused a limited depth into said body to provide opposing surface regions of said body having strong N-type conduction characteristics separated by a high purity region of said body having P-type conduction characteristics, two electrodes respectively connected to said two donor impurity elements, and a third electrode connected to said separating P-type conduction region of said body.

15. An asymmetrically conductive P-N junction device comprising a high purity semiconductor crystal, first and second metal electrodes, a donor impurity element for said semiconductor fused to said first electrode and fused to and diffused within a surface adjacent first region of said crystal, and an acceptor impurity element fused to said second electrode and fused to and diffused within a second surface adjacent region of said crystal, said first and second regions being separated by a thin high purity region of said crystal not diffused with said impurity elements.

16. A high power rectifier comprising a germanium crystalline wafer having a thickness between opposing major surfaces no greater than 0.050 inch and a purity corresponding to a resistivity above 1 ohm centimeter, first and second metal electrodes, a donor impurity element comprising antimony fused to said first electrode and fused to and diffused within a first region of said crystal adjoining one major surface thereof, and an acceptor impurity element comprising indium fused to said second electrode and fused to and diffused within a second region of said crystal spaced from said first region and adjoining the opposite major surface thereof.

17. The asymmetrically conductive device of claim 13 wherein the semiconductor crystal consists essentially of germanium.

18. The asymmetrically conductive device of claim 14 wherein the crystalline semiconductor body consists essentially of germanium.

19. A rectifier comprising a germanium wafer, a layer of tin fused to one face of the wafer and a layer of indium fused to the opposite face thereof.

20. A circuit element comprising a wafer of germanium, tin solder applied to one surface of said germanium wafer to provide one contact thereof, indium solder applied to the opposite surface of said germanium wafer to provide a second electrical conducting contact thereof.

21. A circuit element comprising a wafer of germanium, tin solder fused to one surface of said germanium wafer, and indium solder fused to separate areas of said germanium wafer.

22. A circuit element comprising a wafer of germanium, tin solder applied to one surface of said germanium wafer, a conducting lead secured to said tin solder, indium solder applied to the opposite surface of said germanium wafer, and at least one metallic lead of conducting material secured to said indium solder.

23. A rectifier comprising a wafer of N-type germanium, a layer of tin fused to one face of the wafer and a layer of indium fused to the opposite face thereof.

24. A circuit element comprising a wafer of N-type germanium, tin solder applied to one surface of said germanium wafer to provide one contact thereof, indium solder applied to the opposite surface of said germanium wafer to provide a second electrical conducting contact thereof.

25. A circuit element comprising a wafer of N-type germanium, tin solder fused to one surface of said germanium wafer, and indium solder fused to separate areas of said germanium wafer.

26. A circuit element comprising a wafer of N-type germanium, tin solder applied to one surface of said germanium wafer, a conducting lead secured to said tin solder, indium solder applied to the opposite surface of said germanium wafer, and at least one metallic lead of conduction material secured to said indium solder.

27. A semiconductor device comprising a body of semiconductor material having therein zones of different conductivity types separated by a rectifying barrier, and a heat radiating member in intimate thermal contact with said barrier.

28. An area rectifier including a layer of highly purified germanium, a layer of a metal of group III on one surface of the germanium and an area contact on the opposite surface of the germanium of a material different from said layers.

29. A contact rectifier including a layer of germanium having an ohmic contact and a layer of metal of group III on the germanium.

30. An asymmetrically conductive device comprising a wafer of semiconductor of one conductivity type, a conductive layer secured in conductive relation to said wafer, and a layer of an impurity of opposite conductivity inducing type fused to a surface of said wafer.

31. An asymmetrically conductive device comprising a wafer of semiconductor of one conductivity type, a conductive layer connected to one surface of said wafer, a layer of an impurity of opposite conductivity inducing type fused to an opposite surface of said wafer to provide a surface adjacent region of opposite conductivity type, and another electrode connected to said layer of impurity.

32. An asymmetrically conductive device comprising a wafer of semiconductor of one conductivity type, an electrode secured in conductive relation to said wafer, and a layer of an impurity of opposite conductivity inducing type fused to a partial depth within a surface of said wafer to provide a surface adjacent region of the opposite conductivity type.

33. A rectifier comprising a wafer of semiconductor of one conductivity type, a conductive layer fused to one face of said wafer, and a layer of an impurity fused to an opposite face of said wafer, said impurity inducing conduction characteristics of opposite type in said wafer.

34. A circuit element comprising a wafer of semiconductor of one conductivity type, a conductive layer fused to one portion of said wafer, and an impurity element fused to separate areas of said wafer, said impurity inducing conduction characteristics of opposite type in said wafer.

35. An asymmetrically conductive P-N junction device comprising a wafer of semiconductor of one conductivity type, an impurity element having conduction inducing characteristics in said wafer of opposite conductivity type fused to a first surface adjacent region of said wafer to provide a P-N junction within said wafer, and another impurity element having conduction inducing characteristics in said wafer of opposite conductivity fused to a second surface adjacent region of said wafer to provide another P-N junction within said wafer, said first and second regions being separated by a thin region of said wafer of said one conductivity type.

36. A circuit element comprising a wafer of semiconductor of one conductivity type, a layer of an impurity of opposite conductivity inducing type fused to a partial depth within one surface of said wafer to provide a first surface adjacent region of the opposite conductivity type, and another layer of an impurity of opposite conductivity inducing type fused to a partial depth within an opposite surface of said wafer to provide a second surface adjacent region of the opposite conductivity type, said regions of opposite conductivity type being separated by a region of said one conductivity type.

37. An asymmetrically conductive P-N junction device comprising a wafer of semiconductor of one conductivity type, first and second metallic electrodes, a layer of an impurity of opposite conductivity inducing type fused to a partial depth within one surface of said wafer and to said first electrode, another layer of an impurity of the opposite conductivity type fused to a partial depth within an opposite surface of said wafer and to said second electrode, said regions of opposite conductivity type being separated by a thin region of said one conductivity type, and a third electrode secured in conductive relation to said wafer of said one conductivity type.

References Cited in the file of this patent

UNITED STATES PATENTS

| | | |
|---|---|---|
| 1,994,632 | Becker | Mar. 19, 1935 |
| 2,502,488 | Shockley | Apr. 4, 1950 |
| 2,602,763 | Scaff et al. | July 8, 1952 |
| 2,629,672 | Sparks | Feb. 24, 1953 |
| 2,666,814 | Shockley | Jan. 19, 1954 |
| 2,701,326 | Pfann et al. | Feb. 1, 1955 |
| 2,792,538 | Pfann | May 14, 1957 |